US012701652B2

(12) United States Patent
Li

(10) Patent No.: US 12,701,652 B2
(45) Date of Patent: Aug. 4, 2026

(54) FLEXIBLE CIRCUIT BOARD AND METHOD FOR MANUFACTURING SAME

(71) Applicants: HongQiSheng Precision Electronics (QinHuangDao) Co., Ltd., Qinhuangdao (CN); Avary Holding (Shenzhen) Co., Limited., Shenzhen (CN); GARUDA TECHNOLOGY CO., LTD., New Taipei (TW)

(72) Inventor: Yang Li, Shenzhen (CN)

(73) Assignees: HongQiSheng Precision Electronics (QinHuang Dao) Co., Ltd., Qinhuangdao (CN); Avary Holding (Shenzhen) Co., Limited., Shenzhen (CN); GARUDA TECHNOLOGY CO., LTD., New Taipei (TW)

( * ) Notice: Subject to any disclaimer, the term of this patent is extended or adjusted under 35 U.S.C. 154(b) by 183 days.

(21) Appl. No.: 18/680,529

(22) Filed: May 31, 2024

(65) Prior Publication Data

US 2025/0374421 A1     Dec. 4, 2025

(51) Int. Cl.
   H05K 1/02     (2006.01)
   H05K 3/06     (2006.01)
(52) U.S. Cl.
   CPC ............... H05K 1/028 (2013.01); H05K 3/06 (2013.01); H05K 2201/2081 (2013.01)
(58) Field of Classification Search
   CPC ...................................................... H05K 1/028
   USPC ........................................................ 174/254
   See application file for complete search history.

(56) References Cited

U.S. PATENT DOCUMENTS

| | | | | |
|---|---|---|---|---|
| 2021/0337655 A1* | 10/2021 | Madhava | ............... | B64D 43/00 |
| 2023/0260430 A1* | 8/2023 | Wang | ...................... | G09F 9/335 |
| | | | | 257/40 |
| 2023/0300973 A1* | 9/2023 | Zheng | .................... | H05K 1/028 |
| | | | | 361/749 |
| 2024/0077964 A1* | 3/2024 | Oikawa | ................. | G06F 3/0446 |
| 2024/0310940 A1* | 9/2024 | Li | .......................... | G06F 3/0416 |
| 2024/0324327 A1* | 9/2024 | Lee | ...................... | H10K 77/111 |
| 2025/0089524 A1* | 3/2025 | Liu | .................... | H10K 59/1201 |

FOREIGN PATENT DOCUMENTS

WO     WO-2024039094 A1 *     2/2024     ............... H01Q 1/24

* cited by examiner

*Primary Examiner* — Stanley Tso
(74) *Attorney, Agent, or Firm* — ScienBiziP, P.C.

(57) ABSTRACT

A flexible circuit board includes an inner wiring substrate, a first cover film, a second cover film, a first adhesive block, and two outer wiring substrates. The inner wiring substrate includes a dielectric layer, and the dielectric layer includes a first flat portion, a second flat portion, and a foldable portion connecting the first flat portion and the second flat portion. The first cover film is disposed on the first flat portion and located between the first flat portion and the second flat portion. The second cover layer is disposed on the second flat portion and is located between the first flat portion and the second flat portion. The first adhesive block bonds the first cover film and the second cover film, and the inner wiring substrate is located between the two outer wiring substrate. A method for manufacturing the flexible circuit board is also disclosed.

12 Claims, 11 Drawing Sheets

FLEXIBLE CIRCUIT BOARD AND METHOD FOR MANUFACTURING SAME

FIELD

The subject matter herein generally relates to circuit boards, in particular, to a flexible circuit board and a method for manufacturing the flexible circuit board.

BACKGROUND

With continuous development of science and technology, a requirement of a user for an electronic device continuously develops towards a requirement for miniaturization. If a flexible circuit board is folded, a space occupied by the circuit board is effectively reduced. Because the flexible circuit board is soft, it is impossible to secure the flexible circuit board after it has been folded or the flexible circuit board easily recovers from a folded state, thereby an electronic element on the flexible circuit board easily collides with other elements of the electronic device.

BRIEF DESCRIPTION OF THE DRAWINGS

Implementations of the present technology will now be described, by way of embodiment, with reference to the attached figures.

DETAILED DESCRIPTION

Figures 1, 2, 3:
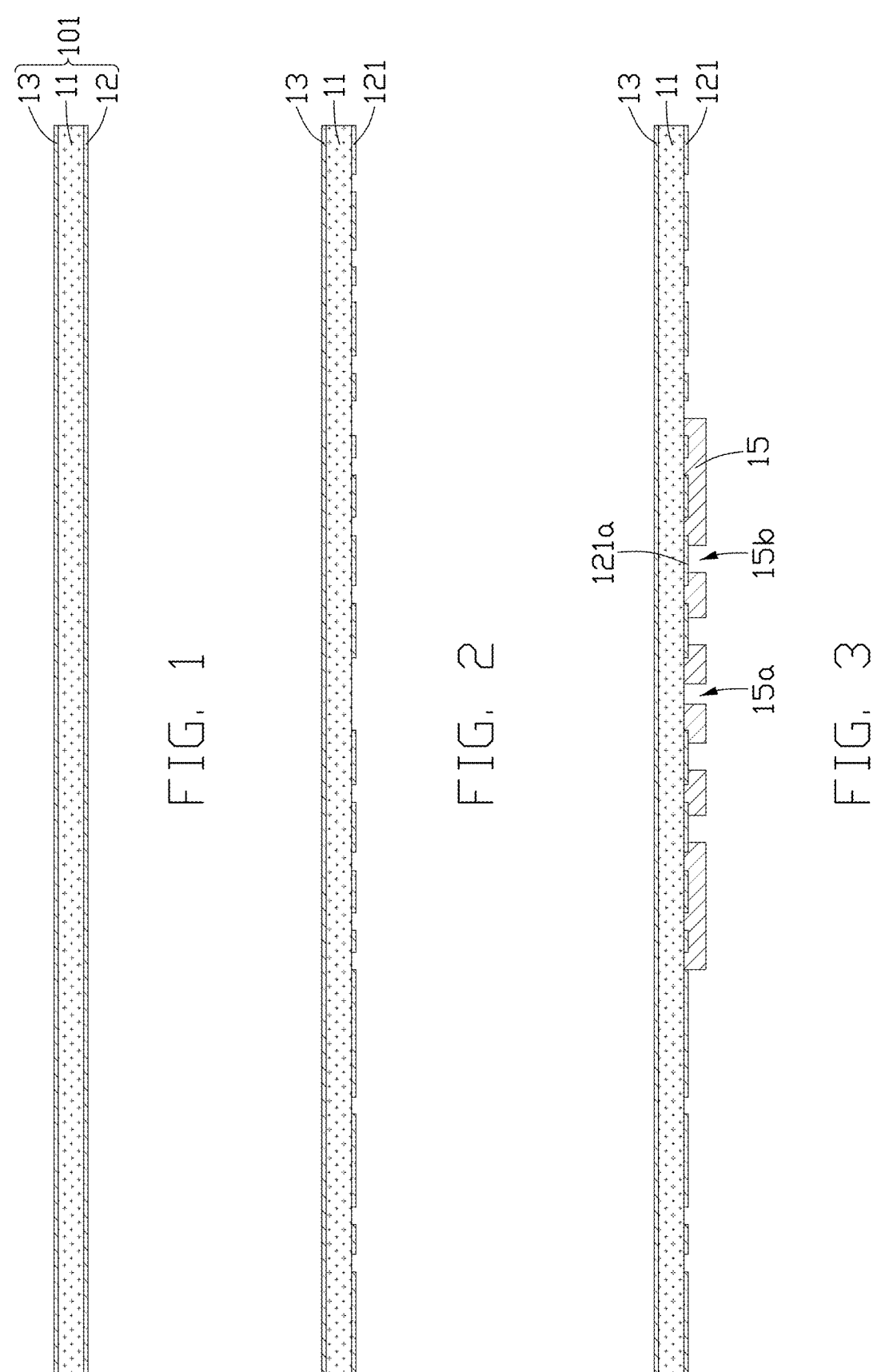
FIG. 1 is a cross-sectional view of an embodiment of a first metal clad substrate according to the present disclosure.
FIG. 2 is a cross-sectional view showing a first conductive wiring layer formed from a first metal layer of FIG. 1.
FIG. 3 is a cross-sectional view showing a solder mask formed on the first conductive wiring layer of FIG. 2.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "connected" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like.

A method for manufacturing a flexible circuit board is provided by way of example, as there are a variety of ways to carry out the method. The method can begin at step S1.

At step S1, referring to FIG. 1, a first metal clad substrate 101 is provided. The first metal clad substrate 101 includes a base layer 11, a first metal layer 12, and a second metal layer 13. The first metal layer 12 and the second metal layer 13 are formed on two opposite surfaces of the base layer 11.

The base layer 11 is flexible. The base layer 11 is made of a resin which may be selected from a group consisting of polyimide, polyethylene terephthalate, polyethylene naphthalate, polyethylene, and any combination thereof. In one embodiment, the base layer 11 is made of polyimide.

The first metal layer 12 and the second metal layer 13 are made of a metal which may be selected from a group consisting of copper, silver, gold, and any combination thereof. In one embodiment, the first metal clad substrate 101 is a double-sided copper clad substrate.

At step S2, referring to FIG. 2, the first metal layer is etched to form a first conductive wiring layer 121.

In one embodiment, the first conductive wiring layer 121 is obtained by an exposure and development process. The exposure and development process includes steps of dry film pressing, exposing, developing, etching, and dry film removing.

At step S3, referring to FIG. 3, a solder mask 15 is formed on a surface of the first conductive wiring layer 121. The solder mask 15 covers a portion of the first conductive wiring layer 121 and infills gaps in the first conductive wiring layer 121 to cover a portion of the base layer 11.

In one embodiment, the solder mask 15 is formed by printing solder resist ink. The solder mask 15 defines a first through hole 15a exposing the base layer 11. In one embodiment, the first through hole 15a extends and penetrates the solder mask 15 to divide the solder mask 15 into two parts that are isolated from each other, and the first conductive wiring layer 121 is divided into two parts isolated from each other through the first through hole 15a.

In one embodiment, the first conductive wiring layer 121 includes a plurality of solder pads 121a, the solder mask 15 defines a plurality of second through holes 15b, and each solder pad 121a is exposed in a corresponding second through hole 15b.

Figures 4, 5:
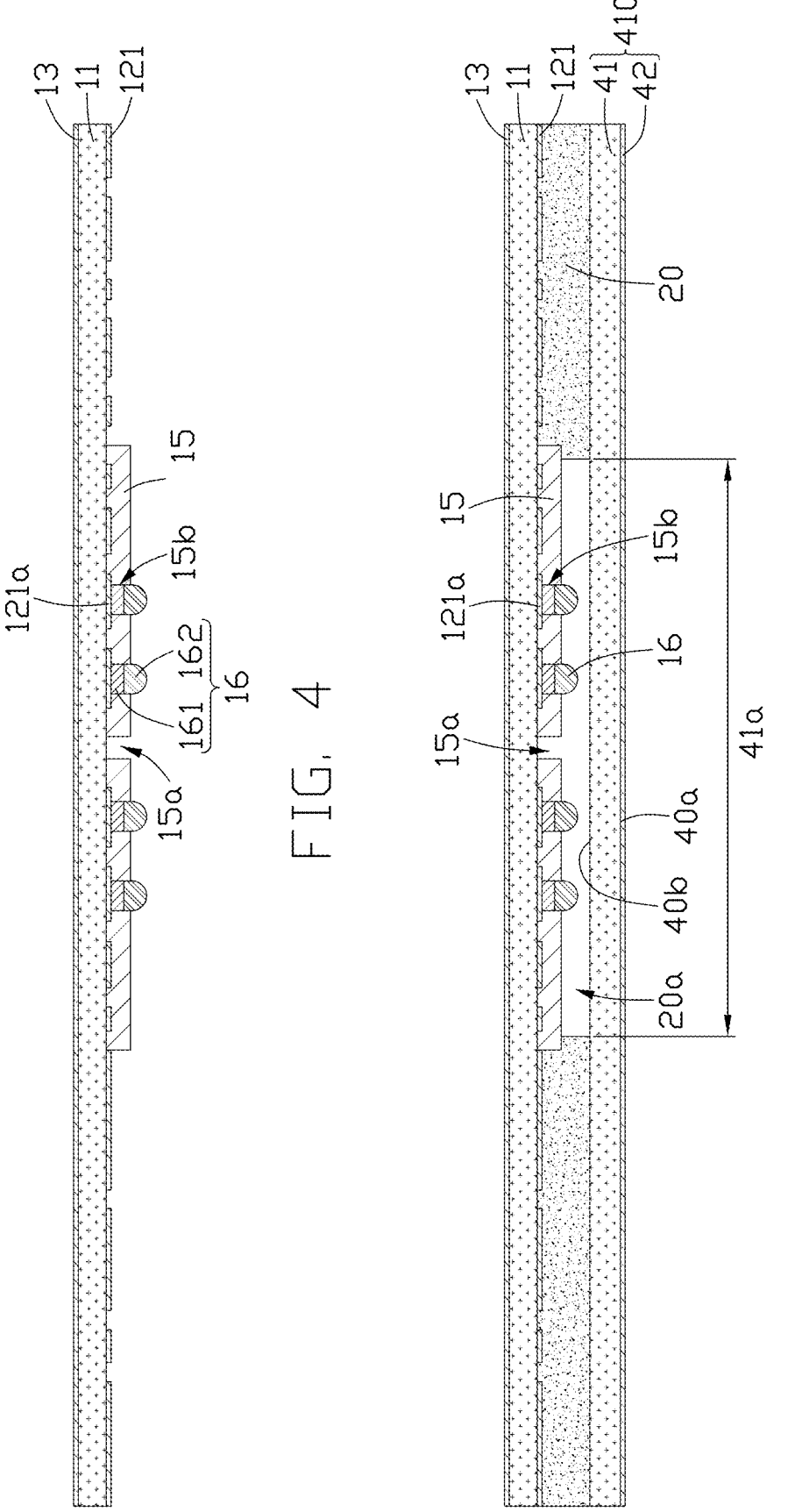
FIG. 4 is a cross-sectional view showing first conductive structures formed on the first conductive wiring layer of FIG. 3.
FIG. 5 is a cross-sectional view showing a second metal clad plate pressed onto the first conductive wiring layer of FIG. 4.

At step S4, referring to FIG. 4, a plurality of first conductive structures 16 are formed in the plurality of second through holes 15b. In one embodiment, each first conductive structure 16 protrudes out of a corresponding second through hole 15b.

In one embodiment, each first conductive structure 16 includes a gold layer 161 formed on a surface of a corresponding solder pad 121a and a solder paste 162 formed on a surface of the gold layer 161 facing away from the corresponding solder pad 121a.

At step S5, referring to FIG. 5, a second metal clad substrate 401 is pressed onto a surface of the first conductive wiring layer 121 through an adhesive layer 20.

The adhesive layer 20 is sandwiched between the first conductive wiring layer 121 and the second metal clad substrate 401 and is adhered to the first conductive wiring layer 121 and the second metal clad substrate 401. The adhesive layer 20 covers a portion of the first conductive wiring layer 121. The adhesive layer 20 defines a first opening 20a. The solder mask 15, the first through hole 15a, and the first conductive structures 16 are exposed in the first opening 20. In some embodiments, the adhesive layer 20 further covers a portion of the solder mask 15, so that a gap is formed between the solder mask 15 and the second metal clad substrate 401. The gap constitutes the first opening 20a.

The second metal clad substrate 401 includes a dielectric layer 41 and a third metal layer 42. The dielectric layer 41 includes a first surface 40a and a second surface 40b opposite to the first surface 40a. The third metal layer 42 is disposed on the first surface 40a and covers the entire first surface 40a. The second surface 40b is adhered to the adhesive layer 20, and a portion of second surface 40b is exposed in the first opening 20a. The dielectric layer 41 further includes a foldable portion 41a exposed in the first opening 20a.

The dielectric layer 41 is flexible. The dielectric layer 41 is made of a resin which may be selected from a group consisting of polyimide, polyethylene terephthalate, polyethylene naphthalate, polyethylene, and any combination thereof. In one embodiment, the dielectric layer 41 is made of polyimide.

The third metal layer 42 is made of a metal which may be selected from a group consisting of copper, silver, gold, and any combination thereof. In one embodiment, the second metal clad substrate 401 is a single-sided copper clad substrate.

Figures 6, 7:
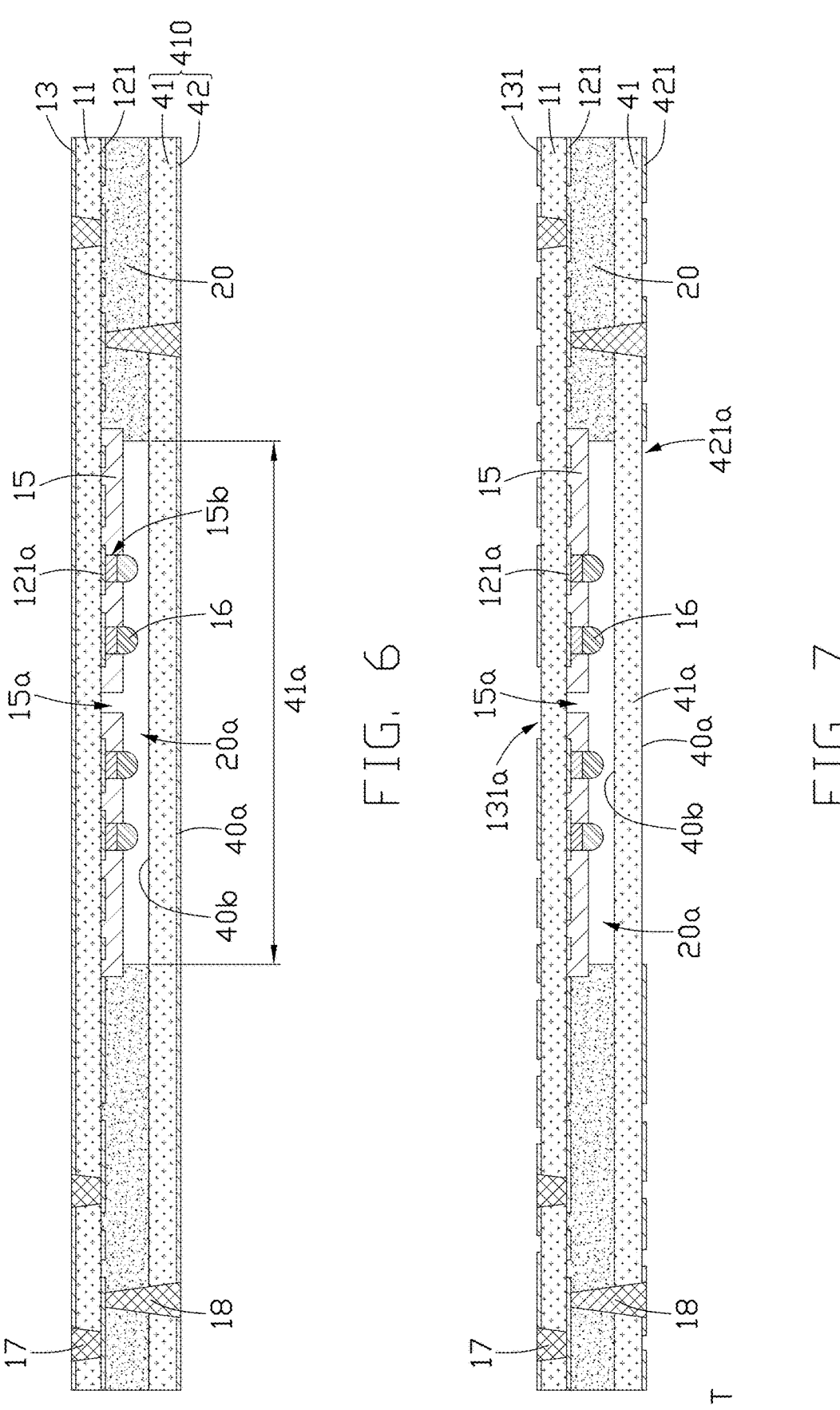
FIG. 6 is a cross-sectional view showing a second conductive structure and a third conductive structure formed on the first conductive wiring layer of FIG. 5.
FIG. 7 is a cross-sectional view showing a second conductive wiring layer and an inner conductive wiring layer respectively formed from a second metal layer and a third metal layer of FIG. 6.

At step S6, referring to FIG. 6, a plurality of second conductive structures 17 and a plurality of third conductive structures 18 are formed. Each second conductive structure 17 penetrates the base layer 11 and connects the first conductive wiring layer 121 and the second metal layer 13. Each third conductive structure 18 penetrates the dielectric layer 41 and the adhesive layer 20 and connects the first conductive wiring layer 121 to the third metal layer 42.

At step S7, referring to FIG. 7, the second metal layer and the third metal layer are etched to form a second conductive wiring layer 131 and an inner wiring layer 421, respectively.

In one embodiments, the second conductive wiring layer 131 and the inner wiring layer 21 are obtained by an exposure and development process.

At step S8, referring to FIG. 7, the second metal layer are etched to form a second opening 131a, and the third metal layer are etched to form a fourth opening 421a. The third opening 131a corresponds in position to the first through hole 15a, and the fourth opening 421a corresponds in position to the first opening 20a. A portion of the base layer 11 is exposed in the second opening 131a, and the second opening 131a penetrates the second conductive wiring layer 131 to divide the second conductive wiring layer 131 into two parts which are isolated from each other. The foldable portion 41a of the dielectric layer 41 is exposed in the fourth opening 421a. In one embodiment, the fourth opening 421a is omitted.

In one embodiment, the second conductive wiring layer 131 and the second opening 131a are prepared through the same exposure and development process, and the inner conductive wiring layer 421 and the fourth opening 421a are prepared through the same exposure and development process.

Figures 8, 9:
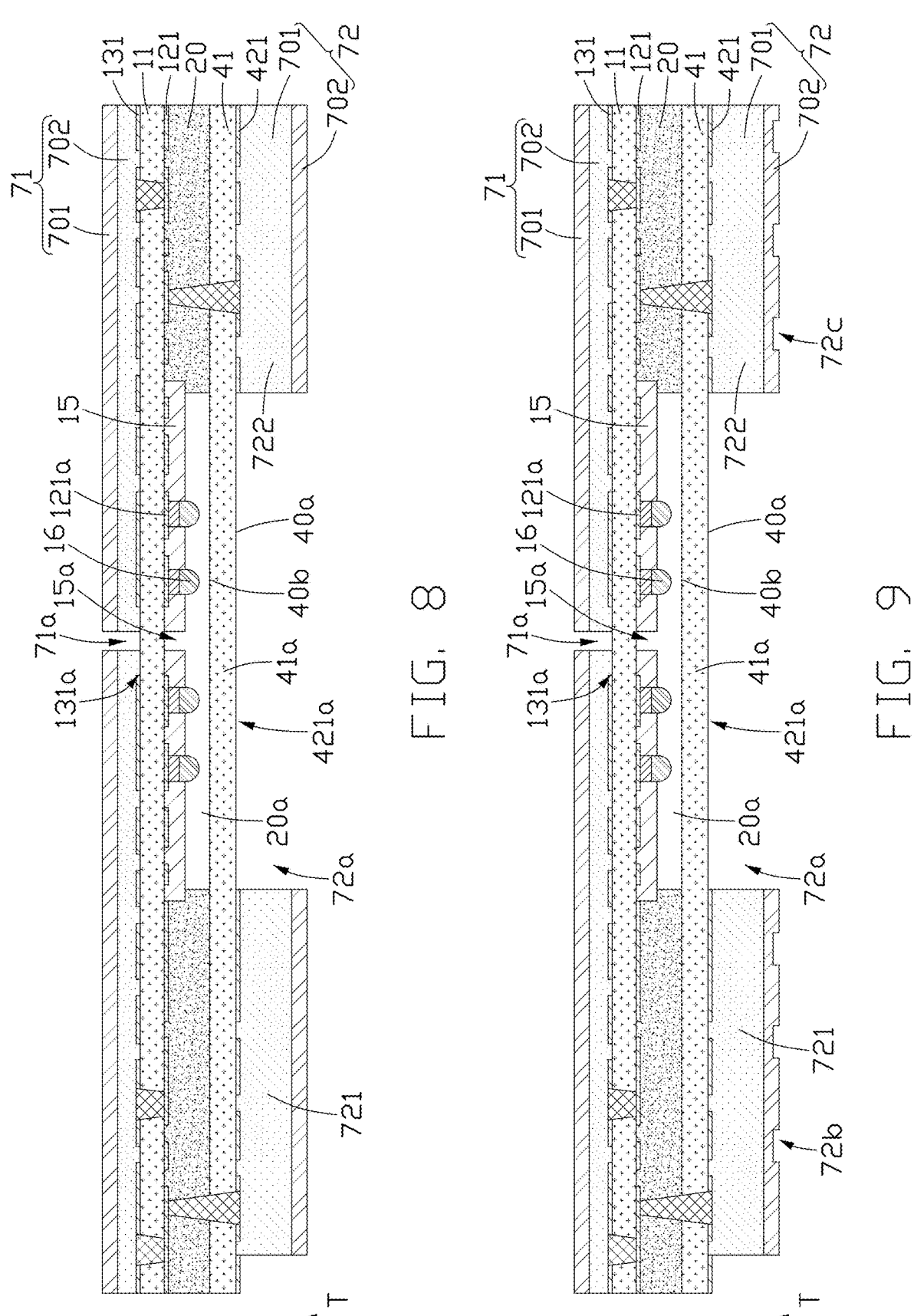
FIG. 8 is a cross-sectional view showing cover films formed on the second conductive wiring layer and the inner conductive wiring layer of FIG. 7.
FIG. 9 is a cross-sectional view showing first grooves and second grooves defined on the cover films of FIG. 8.

At step S9, referring to FIG. 8, two cover films 71 and 72 are respectively formed on the second conductive wiring layer 131 and the inner conductive wiring layer 421. One cover film 71 covers a surface of the second conductive wiring layer 131, and the other cover film 72 covers a surface of the inner conductive wiring layer 421.

The cover film 72 defines a third opening 72a, and the cover film 72 is divided into two parts isolated from each other through the third opening 72a. The third opening 72a corresponds in position to the first opening 20a and the fourth opening 421a. In one embodiment, the third opening 72a is aligned with the first opening 20a and the fourth opening 421a in a thickness direction of the flexible circuit board.

The cover film 71 defines a fifth opening 71a, and the cover film 71 is divided into a third cover film 711 and a fourth cover film 712 that are isolated from each other through the fifth opening 71a. The fifth opening 71a corresponds in position to second opening 131a and the first through hole 15a. In one embodiment, the fourth opening is aligned with the first through hole 15a in the thickness direction T of the flexible circuit board, and a size of the second opening 131a is greater than a size of the fifth opening 170 so that the first conductive wiring layer 121 will not be cut when the base layer 11 is cut subsequently.

Each of the cover films 71 and 72 includes a bonding layer 701 and a protective layer 702. The bonding layer 701 is adhered to the corresponding second conductive wiring layer 131 or inner wiring layer 421. The protective layer 702 is made of a resin.

At step S10, referring to FIG. 9, at least one first groove 72b is formed on a surface of the first cover film 721 facing away from the inner wiring layer 421, and at least one second groove 72c is formed on a surface of the second cover film 722 facing away from the inner conductive wiring layer 421. After the foldable portion 41a is folded, the first groove 72b corresponds in position to the second groove 72c. In one embodiment, the first groove 72b is plural in number, the second groove is plural in number, and the plurality of first grooves 72b are in a one-to-one correspondence with the plurality of second grooves 72c after the foldable portion 41a is folded.

Each of the first grooves 72b and the second grooves 72c can be obtained by mechanical drilling or laser drilling. In one embodiment, the first grooves 72b and the second grooves 72c are obtained by laser drilling.

The first grooves 72b and the second grooves 72c can be defined on the protective layer 702 or on the protective layer 702 and the bonding layer 701. In one embodiment, the first grooves 72b and the second grooves 72c are defined on the protective layer 702.

Figures 10, 11:
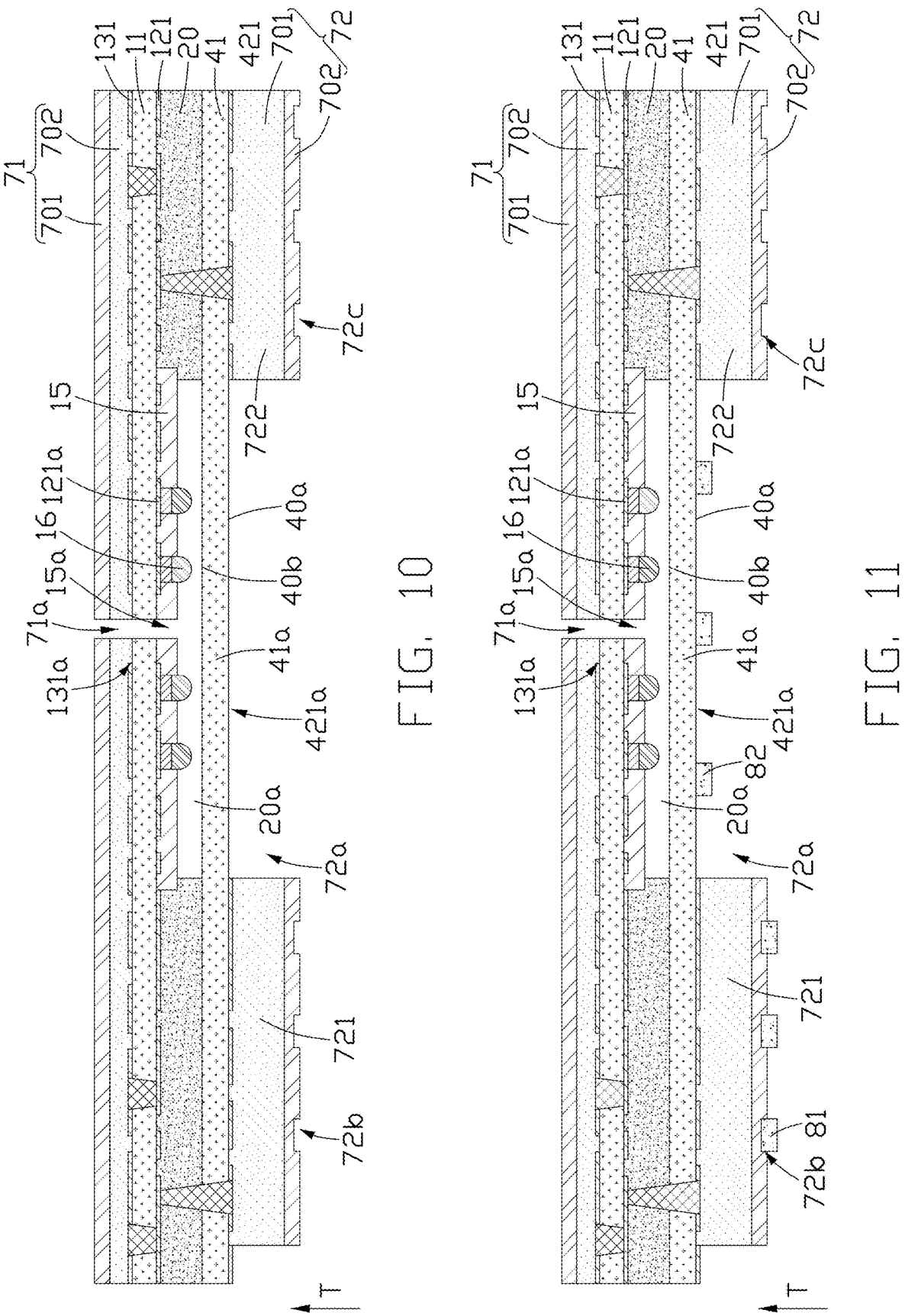
FIG. 10 is a cross-sectional view showing a base layer of FIG. 9 which is cut.
FIG. 11 is a cross-sectional view showing first adhesive blocks and second adhesive blocks respectively formed on the cover film and a foldable portion of a dielectric layer of FIG. 10.

At step S11, referring to FIG. 10, the base layer 11 is cut into two parts isolated from each other along the fifth opening 71a.

The base layer 11 can be cut by mechanical cutting or laser cutting. In one embodiment, the base layer 11 is cut by laser cutting. If the cover film 71 is omitted, the base layer 11 is cut along the second opening 131a.

At step S12, referring to FIG. 11, at least one first adhesive block 81 is formed in at least one of the at least one groove 72b and the at least one second groove 72c, and a plurality of second adhesive blocks 82 are formed on the first surface 40a of the foldable portion 41a of the dielectric layer 41.

In one embodiment, a plurality of first adhesive blocks 81 are only formed in the first grooves 72b or in the second grooves 72c. In other embodiments, the first adhesive blocks 81 are formed in a portion of the first grooves 72b and in a portion of the second grooves 72c which does not correspond to the portion of the first grooves 72b, or the first adhesive blocks 81 are formed in the first grooves 72b and the second grooves 72c.

Figure 12:
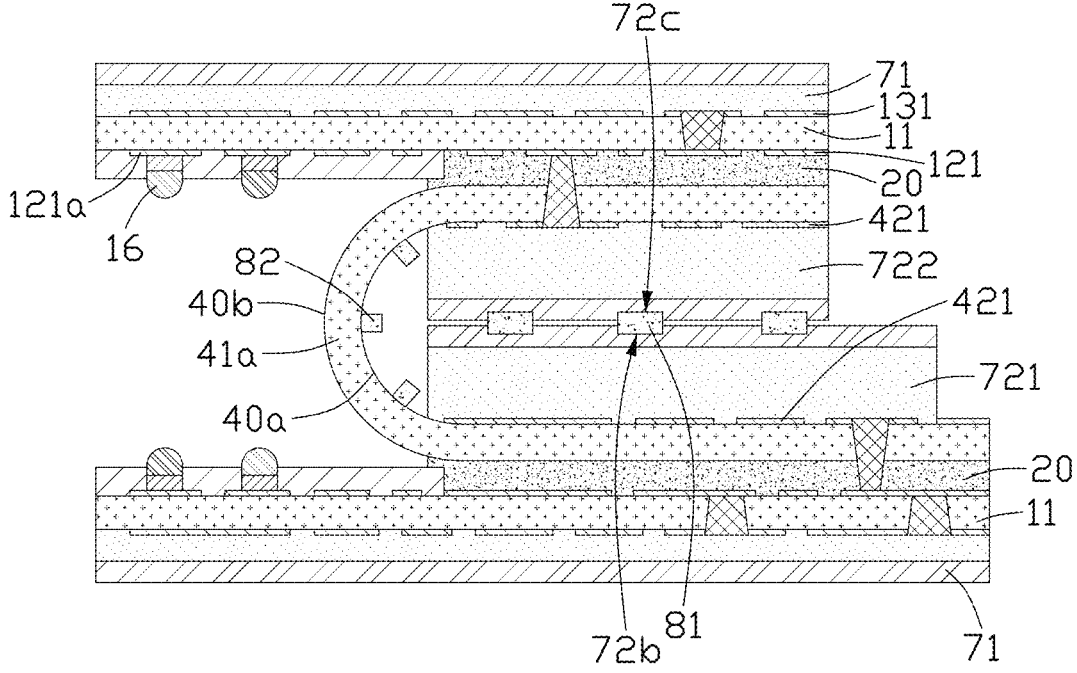
FIG. 12 is a cross-sectional view showing the foldable portion of FIG. 11 being folded.

At step S13, referring to FIG. 12, the foldable portion 41a is folded, so that each of the first adhesive blocks 81 is received in one of the first grooves 72b and in a corresponding second groove 72c, and is adhered to the first cover film 721 and the second cover film 722.

Figure 13:
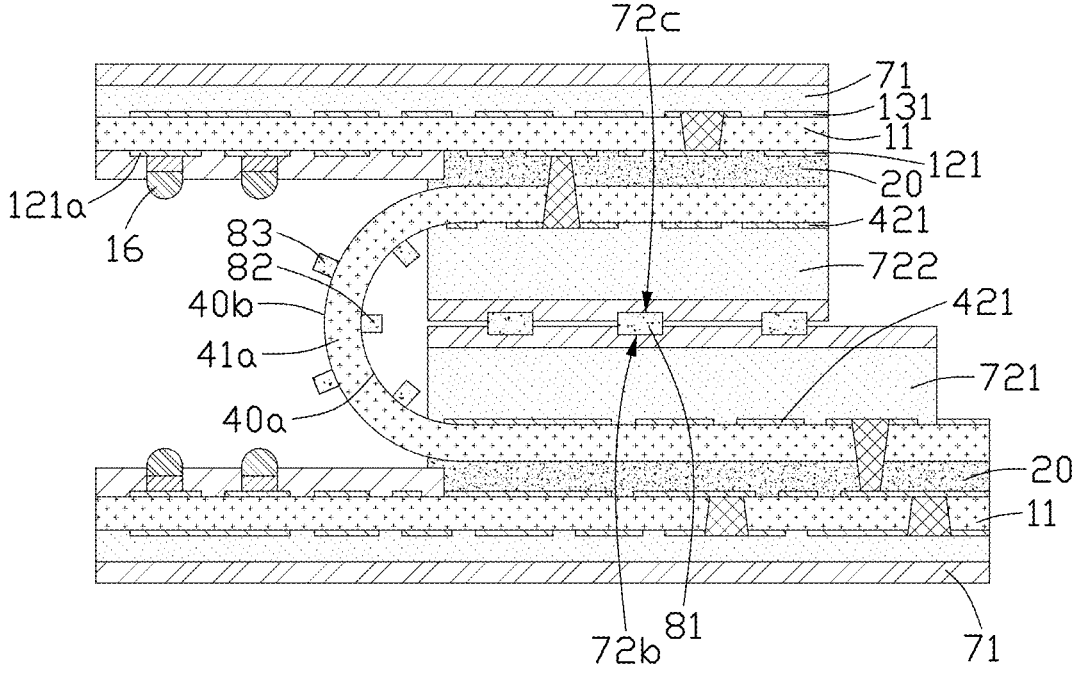
FIG. 13 is a cross-sectional view showing third adhesive blocks formed on a folded portion of FIG. 12.

At step S14, referring to FIG. 13, a plurality of third adhesive blocks 83 are formed on the second surface 40b of the foldable portion 41a. The third adhesive blocks 83 on the first surface 40a and the second adhesive blocks 82 on the first surface 40a are disposed in a staggered manner. The third adhesive blocks 83 are made of non-conducting adhesives.

Figure 14:
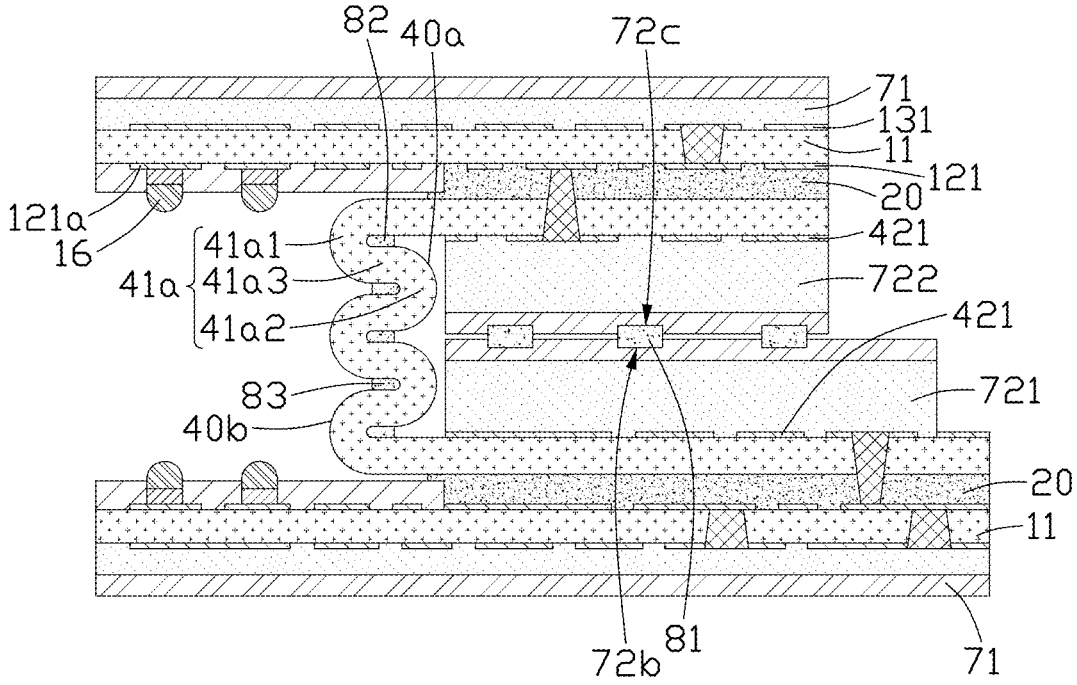
FIG. 14 is a cross-sectional view showing the folded portion of FIG. 13 being bent.

At step S15, referring to FIG. 14, the foldable portion 41a being folded is bent to form a plurality of first bending sections 41a1 and a plurality of second bending sections 41a2 which are alternately disposed in the thickness direction of the flexible circuit board. The plurality of first bending sections 41a1 are bent along a first direction, and the plurality of second bending sections 41a2 are bent along a second direction opposite to the first direction. In other words, a bending direction of the plurality of first bending sections 41a1 is opposite to a bending direction of the plurality of second bending sections 41a2. The first bending sections 41a1 are connected to the second bending sections 41a2 through a plurality of straight sections 41a3, respectively. Each second adhesive block 82 is located inside a corresponding first bending section 41a and bonds the corresponding first bending section 41a1 and two corresponding straight sections 41a3. Each third adhesive block 83 is located inside a corresponding second bending section 41a2 and bonds the corresponding second bending section 41a2 and two corresponding straight sections 41a3. In one embodiment, the first bending section 41a1 is bent from the first surface 40a towards the second surface 40b, and the second bending section 41a2 is bent from the second surface 40b towards the first surface 40a.

In one embodiment, step S15 includes a step of pushing the foldable portion 41a being folded from positions of the second surface 40b where the third adhesive blocks 83 are located towards the first surface 40a to form the first bending sections 41a1, the second bending sections 41a2, and the straight sections 41a3.

In one embodiment, after step S15, the method further includes a step of heating and curing the first adhesive blocks 81, the second adhesive blocks 82, and the third adhesive blocks 83. Thereby improving an adhesive strength between the first adhesive blocks 81 and the first cover film 721 and the second cover film 722, and an adhesive strength between the base layer 11 and the second adhesive blocks 82 and the third adhesive blocks 83.

Figure 15:
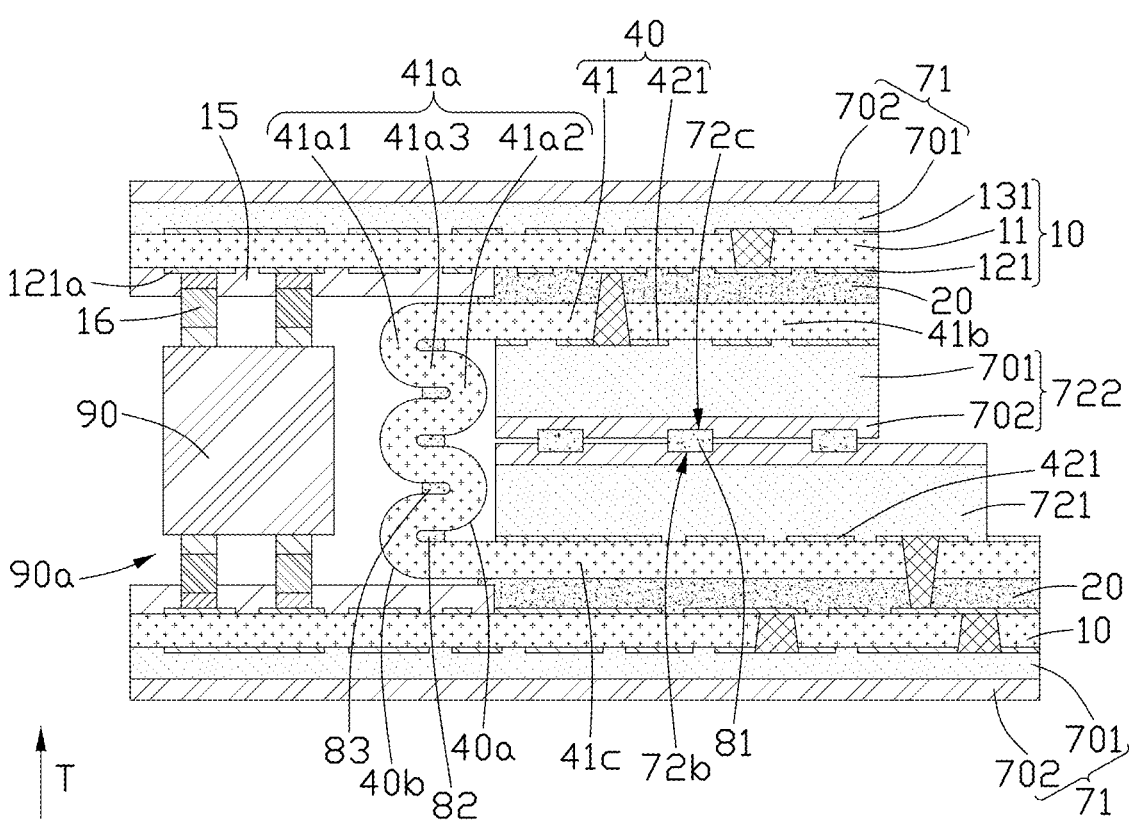
FIG. 15 is a cross-sectional view of an embodiment of a flexible circuit board according to the present disclosure.

At step S16, referring to FIG. 15, an electronic component 90 is mounted on the solder pads 121a.

The electronic component 90 is soldered on the first conductive structures 16 to electrically connect the solder pads 121a.

Referring to FIG. 15, a flexible circuit board 100 is illustrated. The flexible circuit board 100 includes two outer wiring substrate 10, and inner wiring substrate 40, two adhesive layers 20, a first cover film 721, a second cover film 722, and a plurality of first adhesive blocks 81.

The inner wiring substrate 40 is disposed between the two outer wiring substrates 10. The inner wiring substrate 40 is adhered to the two outer wiring substrates 10 through the two adhesive layers 20, respectively. The inner wiring substrate 40 includes the dielectric layer 41 and the inner conductive wiring layer 421. The dielectric layer 41 includes a first flat portion 41c, a second flat portion 41b, and the foldable portion 41a connecting the first flat portion 41c to the second flat portion 41b. The first flat portion 41c is substantially parallel to the second flat portion 41b, and the first flat portion 41c and the second flat portion 41b extend in a same direction from opposite ends of the foldable portion 41a. The dielectric layer 41 further includes the first surface 40a located inside the dielectric layer 41 and the second surface 40b located outside the dielectric layer 41. The inner conductive wiring layer 421 is only disposed on the first surface 40a of the first flat portion 41c and the second flat portion 41b, and is located between the first flat portion 41c and the second flat portion 41b in the thickness direction of the flexible circuit board 100. In other embodiments, the inner conductive wiring layer 421 is further disposed on the first surface 40a of the foldable portion 41a.

The first cover film 721 and the second cover film 722 are respectively disposed on the first flat portion 41c and the second flat portion 41b and cover the inner conductive wiring layer 421. The first cover film 721 and the second cover film 722 are located between the first flat portion 41c and the second flat portion 41b. Neither the first cover film 721 nor the second cover film 722 is disposed on the foldable portion 41a. The first adhesive blocks 81 are disposed between the first cover film 721 and the second cover film 722 and is adhered to the first cover film 721 and the second cover film 722. The two adhesive layers 20 are respectively disposed on the second surface of the first flat portion 41c and the second flat portion 41b and are adhered to the two outer wiring substrates 10.

In one embodiment, the first cover film 721 defines the plurality of first grooves 72b, and the second cover film 722 defines the plurality of second grooves 72c. In the thickness direction T of the flexible circuit board 100, the plurality of first grooves 72*b* are in a one-to-one correspondence with the plurality of second grooves 72*c*. Each first adhesive block 81 is received in one first groove 72*b* and the corresponding second groove 72*c*.

In one embodiment, the foldable portion 41*a* includes the plurality of first bending sections 41*a*1, the plurality of second bending sections 41*a*2, and the plurality of straight sections 41*a*3 respectively connecting the plurality of first bending sections 41*a*1 to the plurality of second bending sections 41*a*2. The plurality of first bending sections 41*a*1 and the plurality of second bending sections 41*a*2 are alternately disposed in the thickness direction T of the flexible circuit board 100, and the bending direction of the plurality of first bending sections 41*a*1 is opposite to the bending direction of the plurality of second bending sections 41*a*2. In one embodiment, the first bending section 41*a*1 is bent from the first surface 40*a* towards the second surface 40*b*, and the second bending section 41*a*2 is bent from the second surface 40*b* towards the first surface 40*a*. The flexible circuit board 100 further includes the plurality of second adhesive blocks 82 and the plurality of third adhesive blocks 83. Each second adhesive block 82 is located in the corresponding first bending section 41*a* and is adhered to the corresponding first bending section 41*a*1 and the corresponding straight section 41*a*3. Each third adhesive block 83 is located in the corresponding second bending section 41*a*2 and is adhered to the corresponding second bending section 41*a*2 and the corresponding straight section 41*a*3.

In one embodiment, each outer wiring substrate 10 includes the base layer 11, the first conductive wiring layer 121, the second conductive wiring layer 131. The first conductive wiring layer 121 and the second conductive wiring layer 131 are disposed on opposite surfaces of the base layer 11. Each adhesive layer 20 covers a portion of the first conductive wiring layer 121 and is adhered to the second surface 40*b* of the corresponding first flat portion 41*c* or the corresponding second flat portion 41*b*.

In one embodiment, each outer wiring substrate 10 further includes the solder mask 15. The solder mask 15 covers the other portion of the first conductive wiring layer 121. The first conductive wiring layer 121 includes the plurality of solder pads 121*a*, and the adhesive layer 20 not covers the solder pads 121*a*. The solder mask 15 defines the plurality of second through holes 15*b* exposing the solder pads 121*a*. In one embodiment, the adhesive layer 20 covers a portion of the solder mask 15 so that a gap is formed between the solder mask 15 and the dielectric layer 41.

In one embodiment, the flexible circuit board 100 further includes at least one electronic component 90. The two outer wiring substrates 10 and the inner wiring substrate 40 enclose a chamber 90*a*, and the electronic component 90 is mounted on the solder pads of at least one outer wiring substates 10 and located inside the chamber 90*a*. In one embodiment, the electronic component 90 is plural in number.

Figure 16:
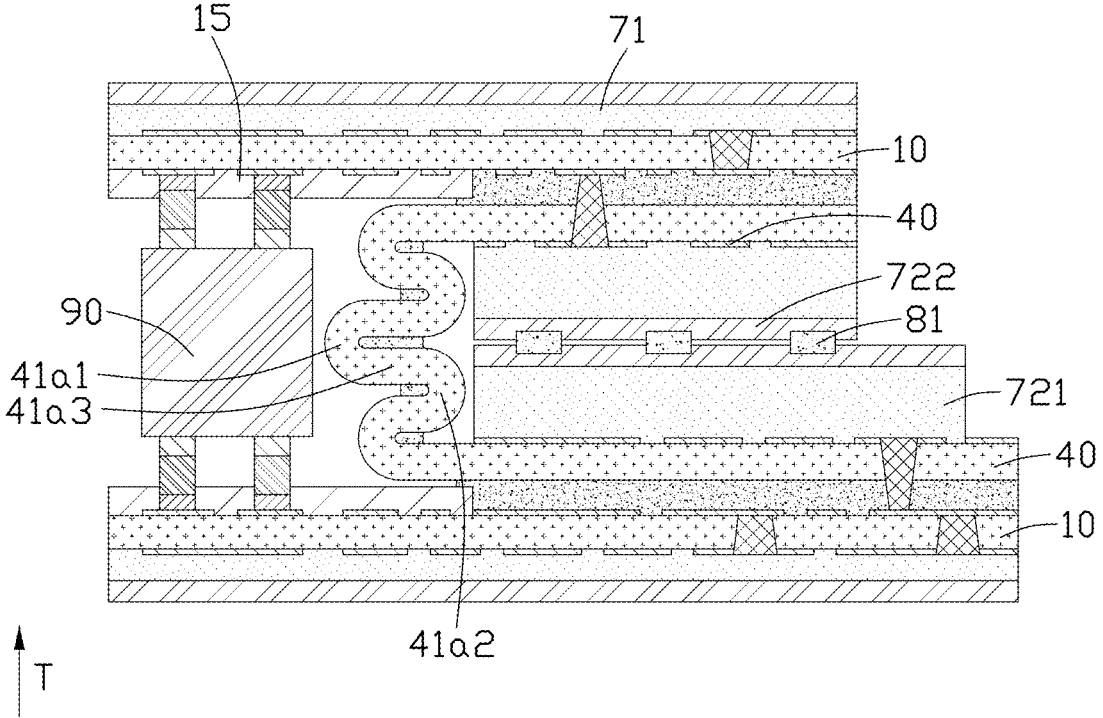
FIG. 16 is a cross-sectional view of another embodiment of a flexible circuit board according to the present disclosure.

In one embodiment, vertices of the plurality of first bending sections 41*a*1 are aligned with each other in the thickness direction T of the flexible circuit board 100, and vertices of the plurality of second bending sections 41*a*2 are aligned with each other in the thickness direction T of the flexible circuit board 100. Referring to FIG. 16, in other embodiments, the vertices of the plurality of first bending sections 41*a*1 are not aligned with each other in the thickness direction T of the flexible circuit board 100. In other embodiments, the vertices of the plurality of second bending sections 41*a*2 are not aligned with each other in the thickness direction T of the flexible circuit board 100.

Figure 17:
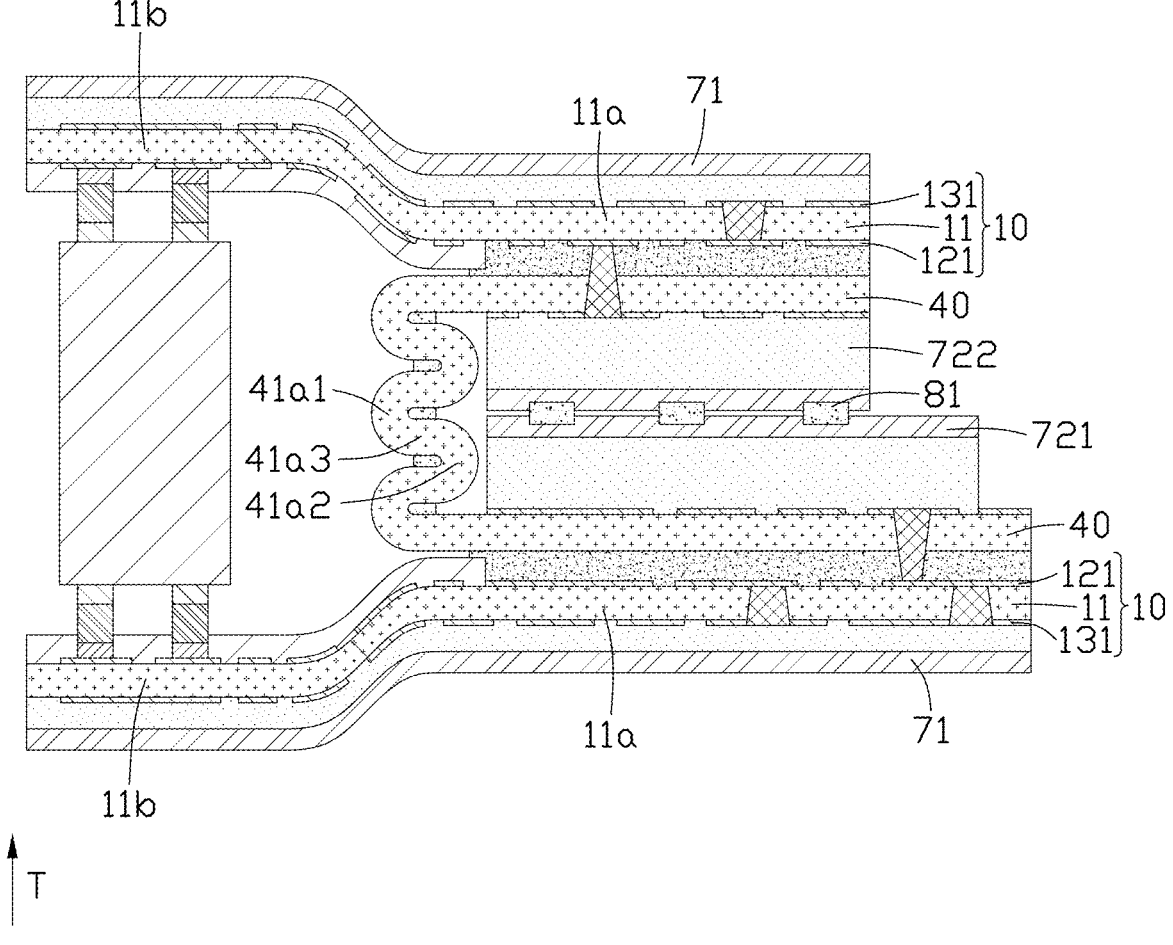
FIG. 17 is a cross-sectional view of yet another embodiment of a flexible circuit board according to the present disclosure.

The base layer 11 includes a first area 11*a* corresponding to the inner wiring substrate 40 and a second area 11*b* corresponding to the electronic component 90. In one embodiment, in the thickness direction T of the flexible circuit board 100, a distance between two first areas 11*a* of the two outer wiring substrates 10 is equal to a distance between two second areas 11*b* of the two outer wiring substrates 10. Referring to FIG. 17, in another embodiment, in the thickness direction T of the flexible circuit board 100, the distance between two first areas 11*a* of the two outer wiring substrates 10 is less than the distance between two second areas 11*b* of the two outer wiring substrates 10. In other embodiments, the distance between two first areas 11*a* of the two outer wiring substrates 10 is greater than the distance between two second areas 11*b* of the two outer wiring substrates 10.

In the flexible circuit board 100 and the method for manufacturing the flexible circuit board 100, the first cover film 721 and the second cover films are respectively disposed on the first flat portion 41*c* and the second flat portion 41*b* of the inner wiring substrate 40 and is located between the first flat portion 41*c* and the second flat portion 41*b*, and the first cover film 721 is adhered to the second cover film 722 through the first adhesive blocks 81, so that the first flat portion 41*c* is fixed relative to the second flat portion 41*b*, thereby reducing a risk of recovering the foldable portion 41*a*1 connecting the first flat portion 41*c* and the second flat portion 41*b* from a folded state. In addition, the foldable portion 41*a* is provided with the plurality of first bending sections 41*a*1 and the plurality of second bending sections 41*a*2, and the second adhesive blocks 82 and the third adhesive blocks 83 are respectively disposed inside the first bending sections 41*a*1 and the second bending sections 41*a*2 and are respectively adhered to the first bending sections 41*a*1 and the second bending sections 41*a*2, so that the risk of recovering the foldable portion 41*a*1 from a folded state is further reduced. In addition, in the method for manufacturing the flexible circuit board 100, after the base layer 11 of the outer wiring substrate 10 is cut into two parts isolated from each other, the foldable portion 41*a* of the inner wiring substrate 40 is folded, so that there is no need to fold the outer wiring substrate 10, thereby reducing a risk of damage of the circuit board damage due to folding. In addition, the electronic component 90 is disposed in the chamber 90*a* enclosed by the two outer wiring substrates 10 and the inner wiring substrate 40, and the electronic component 90 is exposed in an ambient environment, which facilitates heat dissipation of the electronic component 90.

While the present disclosure has been described with reference to particular embodiments, the description is illustrative of the disclosure and is not to be construed as limiting the disclosure. Therefore, those of ordinary skill in the art can make various modifications to the embodiments without departing from the scope of the disclosure as defined by the appended claims.

What is claimed is:

1. A flexible circuit board, comprising:

an inner wiring substrate, the inner wiring substrate comprising a dielectric layer, the dielectric layer comprising a first flat portion, a second flat portion, and a foldable portion connecting the first flat portion and the second flat portion;

a first cover film disposed on the first flat portion and located between the first flat portion and the second flat portion;

a second cover film disposed on the second flat portion and located between the first flat portion and the second flat portion;

a plurality of first adhesive blocks disposed between the first cover film and the second cover film, the plurality of first adhesive blocks bonding the first cover film and the second cover film; and two outer wiring substrates, the two outer wiring substrates being respectively adhered to the first flat portion and the second flat portion through two adhesive layers, and the inner wiring substrate being located between the two outer wiring substrates.

2. The flexible circuit board of claim 1, wherein the foldable portion comprises a plurality of first bending sections and a plurality of second bending sections which are alternately disposed in a thickness direction of the flexible circuit board, a bending direction of the plurality of first bending sections is opposite to a bending direction of the plurality of second bending sections, the flexible circuit board further comprises a plurality of second adhesive blocks and a plurality of third adhesive blocks, each of the plurality of second adhesive blocks is located inside one first bending section of the plurality of first bending sections, and each of the plurality of third adhesive blocks is located inside one second bending section of the plurality of second bending sections.

3. The flexible circuit board of claim 2, wherein a plurality of vertices of the plurality of first bending sections are aligned with each other, and a plurality of vertices of the plurality of second bending sections are aligned with each other.

4. The flexible circuit board of claim 2, wherein a plurality of vertices of the plurality of first bending sections are not aligned with each other, and a plurality of vertices of the plurality of second bending sections are not aligned with each other.

5. The flexible circuit board of claim 2, wherein the foldable portion further comprises a plurality of straight sections respectively connecting the plurality of first bending sections and the plurality of second bending sections, each of the plurality of second adhesive blocks bonds the corresponding first bending section and a corresponding straight section of the plurality of straight sections, and each of the plurality of second adhesive blocks bonds the corresponding first bending section and a corresponding straight section of the plurality of straight sections.

6. The flexible circuit board of claim 1, wherein the first cover film defines a plurality of first grooves, the second cover film defines a plurality of second grooves, and each of the plurality of first adhesive blocks is received in one of the plurality of first grooves and a corresponding second groove of the plurality of second grooves.

7. The flexible circuit board of claim 1, wherein each of the two outer wiring substrate comprises a base layer, a first conductive wiring layer, and a solder mask, the first conductive wiring layer is disposed on a surface of the base layer, the solder mask covers a portion of the first conductive wiring layer, each of the two adhesive layer covers another portion of first conductive wiring layer of a corresponding outer wiring substrate of the two outer wiring substrates.

8. The flexible circuit board of claim 7, wherein each of the two adhesive layer covers further covers a portion of the solder mask of the corresponding outer wiring substrate to form a gap between the solder mask and the foldable portion.

9. The flexible circuit board of claim 7, wherein the two outer wiring substrates and the inner wiring substrate enclose a chamber, the flexible circuit board further comprises an electronic component, the electronic component is electrically connected to the first conductive wiring layer of at least one of the two outer wiring substrates and is located inside the chamber.

10. The flexible circuit board of claim 9, wherein the base layer comprises a first area corresponding to the inner wiring substrate and a second area corresponding to the electronic component, a distance between two first areas of the two outer wiring substrate is equal to a distance between two second areas of the two outer wiring substrates.

11. The flexible circuit board of claim 9, wherein the base layer comprises a first area corresponding to the inner wiring substrate and a second area corresponding to the electronic component, a distance between two first areas of the two outer wiring substrate is less than a distance between two second areas of the two outer wiring substrates.

12. The flexible circuit board of claim 1, wherein the foldable portion is not covered by the first cover film or the second cover film.

* * * * *